(12) United States Patent
Meredith

(10) Patent No.: US 6,310,579 B1
(45) Date of Patent: Oct. 30, 2001

(54) METHOD AND APPARATUS FOR CALIBRATING ANTENNA APPARATUS AND TESTING AN ANTENNA CONNECTED THERETO

(75) Inventor: Sheldon K. Meredith, Redmond, WA (US)

(73) Assignee: Radio Frequency Systems, Inc., Marlboro, NJ (US)

( * ) Notice: Subject to any disclaimer, the term of this patent is extended or adjusted under 35 U.S.C. 154(b) by 0 days.

(21) Appl. No.: 09/570,101

(22) Filed: May 12, 2000

(51) Int. Cl.[7] ................................................. G01R 1/24
(52) U.S. Cl. ........................ 343/703; 324/601; 455/67.1
(58) Field of Search ............................. 343/703; 324/601, 324/645; 455/67.1, 129, 115; G01R 1/24

(56) References Cited

U.S. PATENT DOCUMENTS

| | | | |
|---|---|---|---|
| 4,434,397 | * | 2/1984 | Nelson ................................ 324/58 R |
| 4,580,092 | * | 4/1986 | Squire ................................... 324/57 R |
| 5,408,690 | * | 4/1995 | Ishikawa et al. ....................... 455/115 |
| 5,548,820 | * | 8/1996 | Victorin ................................. 455/67.4 |
| 5,564,086 | * | 10/1996 | Cygan et al. ........................... 455/126 |
| 6,005,891 | * | 12/1999 | Chadwick et al. ..................... 375/224 |
| 6,094,577 | * | 7/2000 | Han ....................................... 455/424 |
| 6,178,310 | * | 1/2001 | Jeong ................................... 455/67.1 |

* cited by examiner

Primary Examiner—Don Wong
Assistant Examiner—Shih-Chao Chen
(74) Attorney, Agent, or Firm—Ware, Fressola, Van Der Sluys & Adolphson LLP

(57) ABSTRACT

A method and apparatus for calibrating an antenna apparatus and testing an antenna connected thereto is provided. The calibration is conducted without an antenna connected to establish a baseline return loss calibration coefficient. Thereafter, after an antenna is connected, a test may be conducted to measure the performance of the antenna on the antenna site apparatus. The calibration process includes measuring a leakage signal, measuring an average of the magnitude of a ripple output of the reflection signal over a frequency range to determine the baseline return loss calibration. Thereafter, if the antenna is connected and the test signal is again swept over frequency, then a new ripple factor is determined for the antenna and a new mean output voltage for Vant is determined. By comparing the new average output voltage for Vant and the baseline return loss calibration, one can determine information about the performance of the antenna.

1 Claim, 4 Drawing Sheets

METHOD AND APPARATUS FOR CALIBRATING ANTENNA APPARATUS AND TESTING AN ANTENNA CONNECTED THERETO

BACKGROUND OF THE INVENTION

1. Technical Field

The present invention relates to antenna testing, and more particularly, to a method and apparatus for testing the Voltage Standing Wave Ratio (VSWR) to determine performance characteristics of an antenna and cabling connected to the antenna.

2. Description of Related Art

FIG. 1 shows a testing apparatus generally indicated as 10 known in the art for testing the VSWR of one or more receive antennas generally indicated as 12 and cabling associated with a typical cellular base site. The testing apparatus 10 includes test equipment 14 and two directional couplers 16, 18 for coupling between the antenna 12 to a receive multi-coupler (RMC) 20.

An antenna connector 22 couples the antenna 12 to the directional coupler 16. A second directional coupler 18 couples the directional coupler 16 to the receive multi-coupler (RMC) 20. The antenna connector 22 and the directional couplers 16, 18 provide a signal path between the antenna 12 and the receive multi-coupler 20 as shown by a signal line 23.

The receive multi-coupler 20 includes a filter 24, an amplifier 26 and a splitter 28. The filter 24 filters the antenna signal received by the antenna 12 and provides a filtered signal. The amplifier 26 amplifies the filtered signal and provides an amplified and filtered antenna signal. The splitter 28 splits the amplified and filtered signal into several component parts and provides split signals to receivers 30, 32.

The test equipment 14 includes a test signal source 40, two receivers 42, 44 and a signal processor 46. The test signal source 40 provides a test signal indicated as 41 to the directional coupler 18. The directional coupler 16 provides one part of the test signal, known as a forward signal indicated as 41a, to the receiver 44. The test signal 41 reflects off the antenna 12, and the directional coupler 16 provides a reflected part of the test signal, known as a signal indicated as 41b, to the receiver 42. The receivers 42, 44 respectively measure the amplitude and the signal strength of the forward and reverse signals and provide this measurement information to the signal processing circuit 46. The signal processing circuit 46 processes the measurement information, and provides signal processing with an indication of the antenna reflection coefficient and the VSWR of the antenna 12.

The VSWR is an important factor that affects the performance characteristics of an antenna and provides important information about how the antenna will operate. If there is a mismatch of impedance along a circuit including a transmitter or receiver, transmission line and an antenna, there will be an inefficient transfer of energy either from the transmitter via the transmission line to the remote wireless receiver, or from the remote wireless transmitter via the antenna and the transmission line into the receiver. Because of the impedance mismatch, not all of the energy will flow forward from the transmitter to the antenna or similarly from the antenna to a receiver.

When an electromagnetic wave is sent down a transmission line which is not terminated with its characteristic impedance, some of the energy is reflected back from the termination. In some locations along the transmission line, the reflected wave re-enforces the direct wave. In other locations along the transmission line, the reflected wave opposes the direct wave. The result is a stationary pattern of waves along the line called standing waves. The VSWR is the ratio of the maximum to minimum voltage of a standing wave along a transmission line.

More particularly, the standing waves created in a transmission line are standing waves of voltage and current on the line. The voltage maximums and minimums of a standing wave have a constant amplitude. The ratio of the maximum to minimum voltage on a line is called the VSWR and is given by the following equation:

$$VSWR = V_1\, max / V_1\, min$$

If the source and load impedances match that of the transmission line, there are no standing waves and the VSWR is 1. However, if there is an impedance mismatch between the transmission line and the source and load impedances, the VSWR will be greater than 1.

While the above equipment and method for testing the characteristics of the antenna 12 provides a generally reliable and accurate indication of the antenna and cabling signal transmission characteristics, this test equipment is very expensive to implement because of the requirement of the directional couplers and signal lines. One problem with the known test equipment is that it requires two directional couplers, receivers, and associated cabling, a first for providing the test signal, and a second for returning the unreflected and reflected signals back to the equipment. Directional couplers and associated cabling are expensive (about $150++ depending on quantity) per antenna, and there are a number of antennas per cellular site. Therefore, a method and apparatus for testing the VSWR of an antenna, which is easy and more cost effective to implement, is needed.

SUMMARY OF THE INVENTION

The present invention provides a test apparatus for testing the VSWR of an antenna which is easy and cost effective to implement.

The present invention includes a method and apparatus for calibrating an antenna apparatus and testing an antenna connected thereto. The calibration is conducted without an antenna connected to establish a baseline return loss calibration coefficient. Thereafter, after an antenna is connected, a test may be conducted to measure the performance of the antenna on the antenna site apparatus.

The calibration process includes measuring a leakage signal with the antenna port well terminated and the magnitude of the reflected signal with an open or shorted antenna port. Thereafter, if the antenna is connected and the test signal is swept over frequency, then a new return loss coefficient is computed by subtracting the leakage signal component, and comparing the result to the return signal strength from the open or shorted circuit condition.

An advantage of the present invention is that it provides a reliable and accurate indication of the antenna performance characteristics of an antenna used to receive RF signals at a cellular base site.

The present invention provides a significant improvement over the prior art by providing a method and apparatus for testing the antenna characteristics of an antenna for a cellular base site by eliminating the need for an additional directional coupler, associated cabling and receiver that are otherwise required in the prior art for testing the characteristics of each antenna in the cellular site. Additionally, the method and apparatus of the present invention provides a highly accurate and reliable indication of antenna performance.

The foregoing and other objects, features and advantages of the present invention will become more apparent in light of the following detailed description of exemplary embodiments thereof as illustrated in the accompanying drawings.

DETAILED DESCRIPTION OF THE INVENTION

Figure 1:
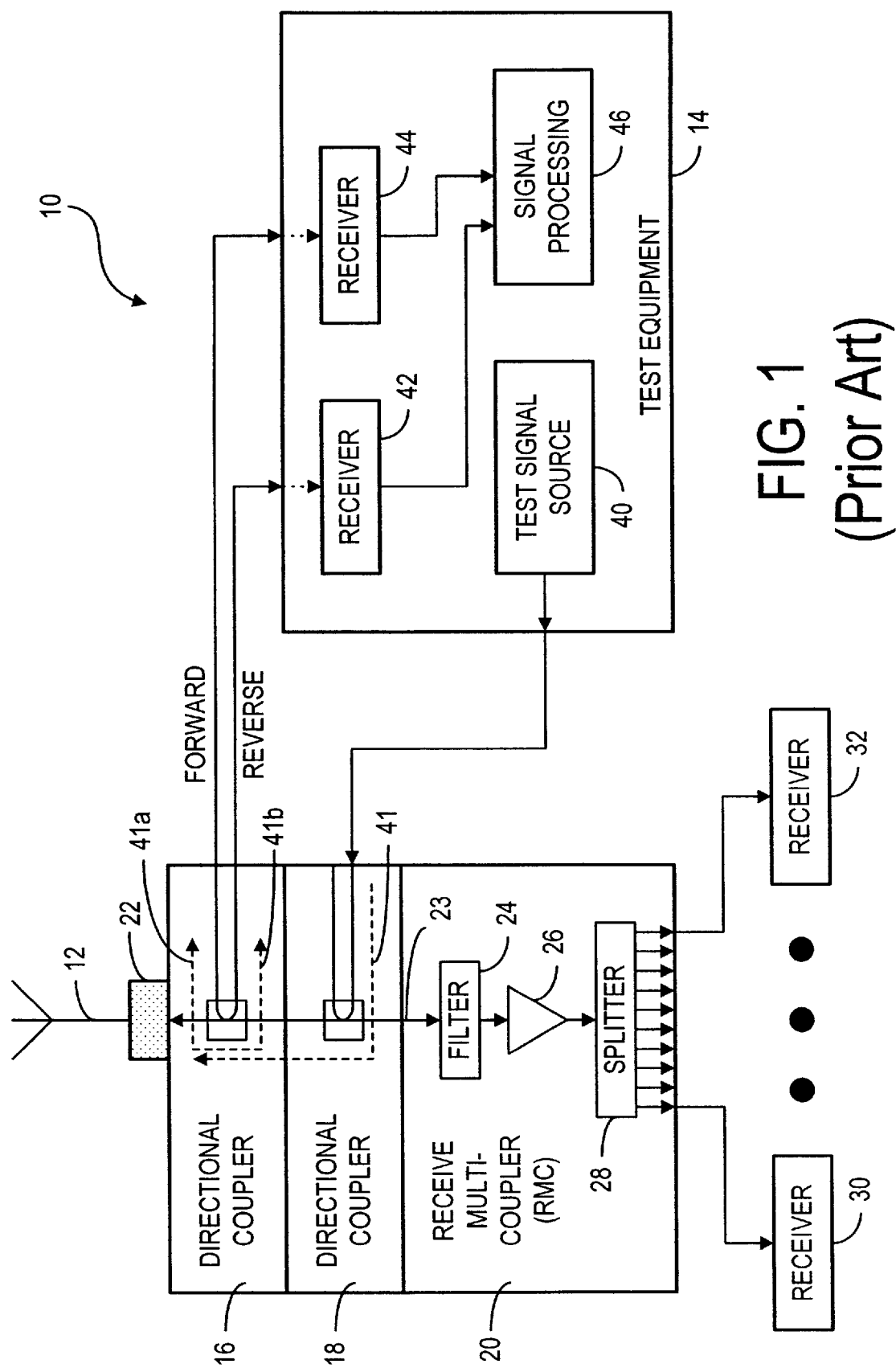
FIG. 1 is a schematic block diagram of prior art test system for testing the VSWR of an antenna.
Figure 2:
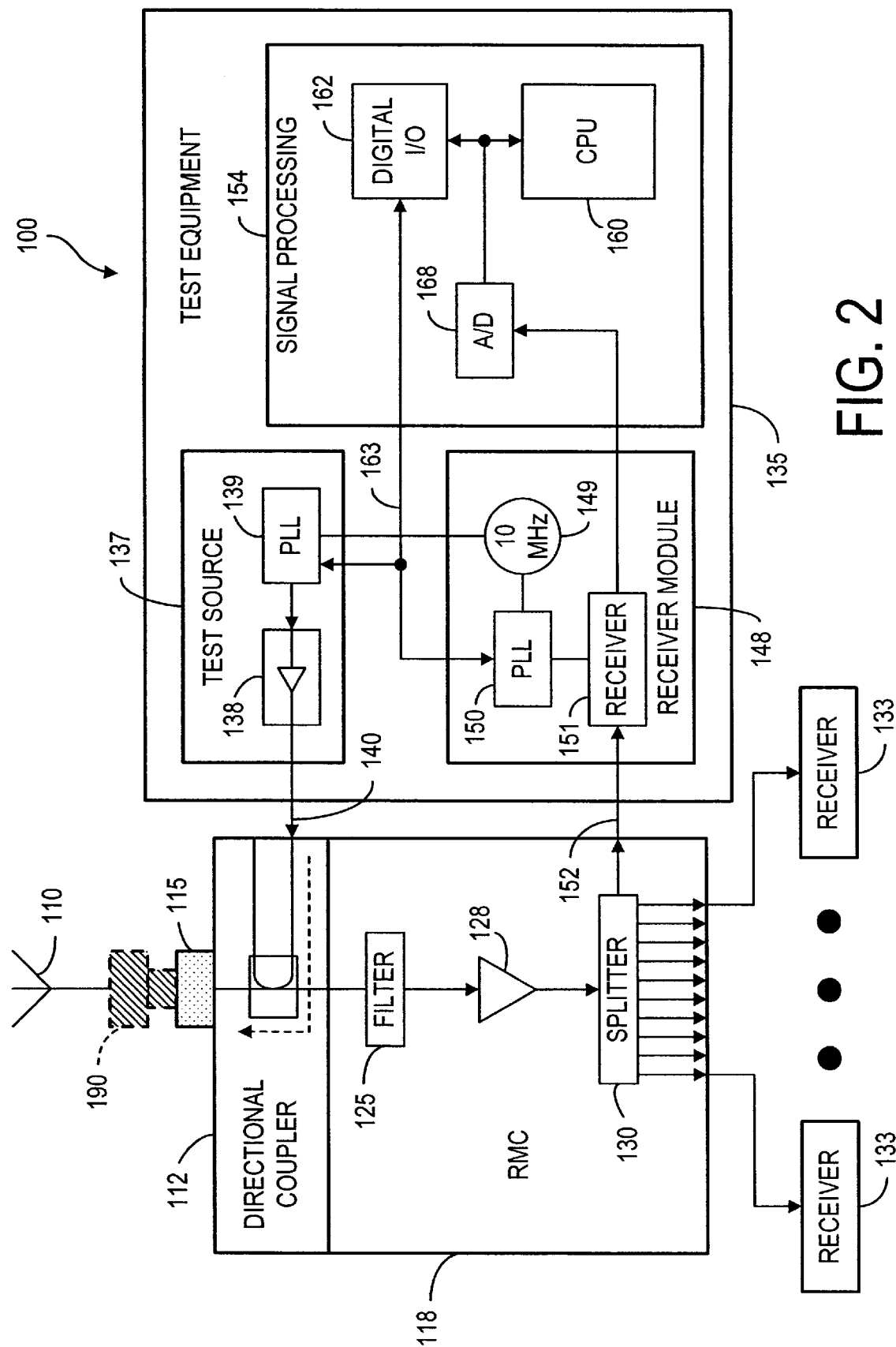
FIG. 2 is a schematic block diagram of test equipment of the present invention for testing the characteristics of an antenna.

FIG. 2 shows a test apparatus generally indicated as 100 that is the subject matter of the present invention.

As shown, an antenna 110 is interconnected to a directional coupler 112 by an antenna coupler (connector) 115. The directional coupler 112 interconnects the antenna 110 to a receive multi-coupler 118. The receive multi-coupler 118 includes a filter 125, an amplifier 128 and a signal splitter 130. When an RF signal is received by the antenna 110, it is provided via the antenna connector 115 and the directional coupler 112 to the receive multi-coupler 118. Within the receive multi-coupler 118, the RF signal is filtered by the filter 125, amplified by the amplifier 128 and then provided to the signal splitter 130 where it is divided into a plurality of equal part signals. Each of the equal part signals from the signal splitter 130 is provided to receivers 133 of the cellular base site.

Test equipment 135 is provided for testing the performance characteristics of the antenna 110. The test equipment 135 includes a test source 137 for providing test signals to the directional coupler 112 via a signal line 140; a receiver module 148 for receiving signal samples from the splitter 130 of the receive multi-coupler 118 via a signal line 152; and signal processing equipment 154 for analyzing results of the tests. The test source 137 includes a phase locked loop 139, which receives an output from an oscillator 149 of the receiver module 148. The phase locked loop 139 is also responsive to a control signal provided by a central processing unit 160 via a digital input/output port 162 and central processing unit bus 163 for determining the frequency of the test signal which will be provided to the directional coupler 112 via the signal line 140. The output of the phase locked loop 139 is provided to a limiter 138 which limits the magnitude of the test signal before it is provided to the directional coupler 112 via the signal line 140.

The receiver module 148 is interconnected to one output of the splitter 130 within the receive multi-coupler 118 by the signal line 152. The receiver module 148 includes the oscillator 149, a phase locked loop 150 and a receiver 151.

The phase locked loop 150 receives control signals from the central processing unit 160 via the digital input/output port 162 and bus 163 for controlling the frequency at which the receiver 151 will monitor for signal strength measurements. The central processing unit 160 controls the phase locked loop 150 and the receiver 151 to cooperate to measure the signal strength of the signal provided on the line 152 from the signal splitter 130 at a desired receive frequency.

The signal strength measurement output of the receiver 151 is provided to the central processing unit 160 via an analog-to-digital (A/D) converter 168. The A/D converter 168 provides the central processing unit 160 with digital signals indicative of the RF signal power that received signals are detected by the receiver 151.

Basic Principles of the Calibration Process

The basic operation of the test apparatus 100 is best understood by example.

First, a 50 ohm load is placed on the antenna connector 115 (i.e. antenna connection) of the directional coupler 112, and a load is placed on a coupler port 113, i.e. the forward coupled port. When the test signal is provided from the test source 137, a leakage signal is received by the receive module 148. The signal corresponds to the "perfectly matched" condition. The square root of this magnitude corresponds to the leakage voltage $V_{leak}$. The leakage signal detected is a measurement of power. The leakage power may be converted into a leakage voltage by taking the mathematical square root, by neglecting, of course, the impedance. Under the assumption that the impedance is defined to equal 1, then the leakage voltage is simply the square root of the leakage power.

Second, the 50 ohm load is removed from the antenna connector 115 and is instead short-circuited. When the test signal is provided from the test source 137, a reflection signal is received by the receive module 148. The reflection signal will include two signal components, i.e. a reflection component signal and a leakage component signal of the test signal. The reflection signal is a very large magnitude signal coming back through the coupler, ideally a 100% reflection signal, and much stronger than that of the leakage signal (on the order of 20 dB higher). The reflected signal detected is again a measurement of power, which may be converted into a reflected voltage by taking the square root, as discussed above. This computed voltage represents 100% reflection.

Third, an antenna is connected to the connector 115. The test source signal is swept over a frequency range and the receiver 148 measures the power level on line 152. Depending upon the frequency, the reflection component and the leakage component of the test signal will be in-phase or out-of-phase because each component has a different path length in order to get to the receiver module. The longer the delay between the reflection and leakage components of the test signal, the better the present invention is able to test to antenna. The frequency of the test signal is swept over a frequency range to measure the magnitude of the reflection as a function of frequency. In order to accomplish the frequency sweep, the central processing unit 160 will provide a frequency sweep signal to the phase locked loop 139. In response to the frequency sweep signal, the reflection signal has a ripple output. A peak of the ripple output occurs when the leakage component signal of the test signal is in-phase with the reflection component signal of the test signal. In effect, the phase rotation of the reflection component signal is different than the phase rotation of the leakage component of the test signal. A minimum of the ripple output signal occurs when the leakage component signal is out-of-phase with the reflection component signal. The square root is taken for all swept frequency measurements. The peak voltage is the sum of the leakage and antenna reflector voltages. The first of these is known and can be subtracted from the peak value to isolate the antenna contribution only:

$$V_{ANT} = V_{PEAK} - V_{LEAKAGE}$$

By comparing the signal voltage reflected from the antenna to the voltage reflected under the open or short circuit condition, one can complete the ant return loss as:

$$\text{Return Loss} = (V_{ANT}/V_{OPEN})^2.$$

In operation, a load connected will reduce the voltage magnitude of the reflection component signal, but will not have any effect substantive on voltage magnitude of the leakage signal. The leakage signal will always substantially be or stay the same. This relationship allows one to hook up an antenna after calibration by using the known magnitude of the reflection signal and the leakage signal.

As a person skilled in the art would appreciate, one cannot compare two signals on a particular frequency because both of those measurements contain the directivity leakage. And, therefore, for small return losses off of an antenna the magnitudes of those two vectors begin to get comparable to the leakage signals vector and the reflective signal output voltage from the second coupled port. Both of those become comparable in magnitude, and one does know what the phase relationship is. But if one calibrates the antenna beforehand, and one knows what the magnitude of the leakage signal is, then the antenna is swept over the frequency range, and the ripple output is measured. Then one can remove the ripple, and determine the voltage of the antenna associated with the voltage of the reflection signal. Since one knows what the voltage of the reflection component was, when there was a short circuit, the ratio between those two squared is the return loss.

The Operation of the Test Apparatus 100

Prior to installation of the antenna 110, the test source 137 provides the test signal to the directional coupler 112 via the signal line 140, as discussed above. The reflected and leakage signals are provided via the filter 125, the amplifier 128, and the splitter 130 to the receiver module 148. The reflected signal is provided from the receiver module 148, sampled by the A/D converter 168, and provided to the central processing unit 160.

During injection of the test signal by the test source 137 into the antenna 110, the central processing unit 160 controls the phase locked loop 139 to vary the frequency of the test signal.

Signal measurements are made by the receiver module 148 of signals received from the splitter 130 via the signal line 152. These signal measurements are indicative of the combination of the reflected signal from the antenna 110 and the leakage signal from the directional coupler 112.

Figure 3:
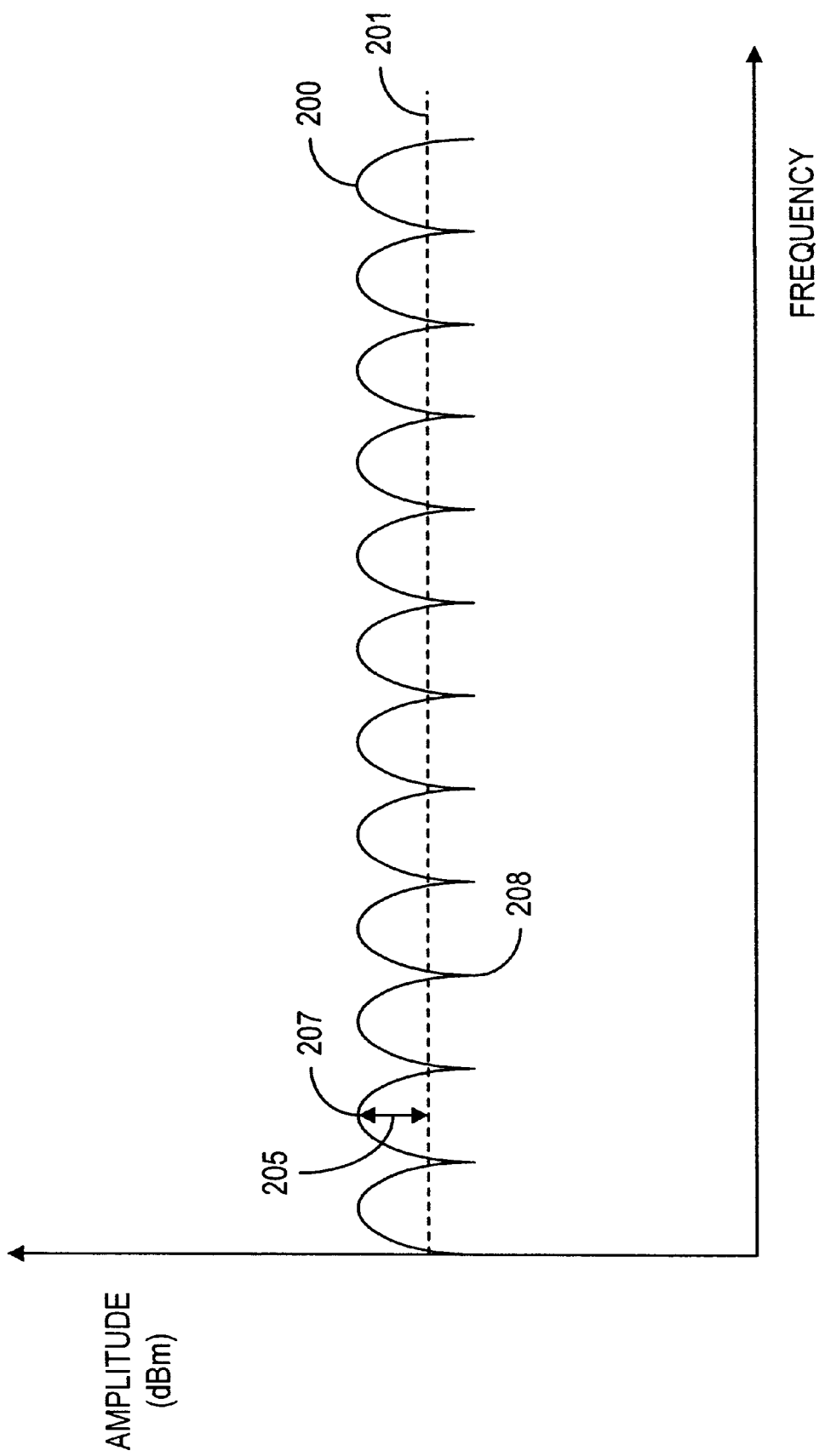
FIG. 3 is a graph illustrating the relationship between an amplitude of a reflected signal measured at a receive multi-coupler as the frequency of the test signal is swept over a frequency range.

FIG. 3 shows a graph of an output signal 200 of the splitter 130 during antenna testing as the frequency of the test is swept over a frequency range. In FIG. 3, the output signal 200 is a combination of the leakage signal from the directional coupler 112 and the reflected signal.

The phase change of the signal is defined by the following relationship:

$$\Delta \Phi = 2 \pi (\Delta f) \tau$$

where $\Delta \Phi$ is a phase shift (of the leakage signal or the reflected signal), $\Delta f$ is a frequency shift (of the test signal) and $\tau$ is a time delay for the test signal to travel from the test source 137 to the receiver 151. Depending on the frequency, the reflected signal and the leakage signal will be in-phase or out-of-phase due to the different path lengths. A peak 207 of the output signal 200 occurs when the reflected signal and the leakage signal are in-phase; and a minimum 208 of the output signal 200 occurs when the reflected signal and the leakage signal are out-of-phase. In effect, the magnitude of the leakage signal will be generally constant because of the very short time delay associated with the signal; however, the reflected signal will vary more as a function of the frequency of the injected test signal. Therefore, a calibration coefficient can be determined of the reflected signal by performing a peak-to-average ratio of the signal provided to the receiver 151. The average, illustrated by the line 201 in FIG. 3, is equal to the leakage signal. The reflected signal 205 is the difference between the peak 207 of the output signal 200 and the leakage signal 201.

The signal strength measurement information illustrated in FIG. 3 is processed by the central processing unit 160. This information can be used in several ways for determining the performance of the antenna 110 and associated cabling. For example, a threshold value may be determined based on the calibration value which is indicative of 100% reflected power. The threshold value may be a percentage of the calibration value, 3 dB down from the calibration value, or other suitable threshold determination. This value is stored in the central processing unit 160. Thereafter, during testing of the antenna 110, if the peak amplitude 207 of the output signal 200 (signal strength signal) illustrated in FIG. 3 is greater than or equal to the threshold value, a determination is made that an antenna failure has occurred. The antenna failure may be a failure of the connection between the antenna and the antenna coupling 115 or the antenna coupling and the directional coupler 112. Alternatively, the antenna failure may be indicative of other damage to the antenna such that a majority of the energy supplied to the antenna is reflected back into the directional coupler 112 and the receive multi-coupler 118.

As described above, the calibration value ($P_{100\%}$) and the output signal 200 ($P_{out}$) are measurements of the signal strength or power level as measured in dB. As a person skilled in the art would appreciate the power of an RF signal is directly proportional to the square of the voltage signal. Therefore, a calibration voltage ($V_{100\%}$) may be determined as the square root of the calibration power level. Additionally, the reflected voltage ($V_{REFL}$) is given by the following relationship:

$$V_{REFL} = V_{PEAK} - V_{LEAKAGE} = (P_{PEAK})^{1/2} - (P_{LEAKAGE})^{1/2}$$

where $V_{PEAK}$ is the peak voltage, $P_{PEAK}$ is the peak power 207 of the output signal 200, $V_{LEAKAGE}$ is the leakage voltage, and $P_{LEAKAGE}$ is the leakage power level 201.

The reflected voltage ($V_{REFL}$) above can then be used to determine a reflection co-efficient. The reflection co-efficient (Rc) is given by the following relationship:

$$Rc = (\text{Log } [V_{REFL}/V_{100\%}]) * 10$$

The phase locked loops 139 and 150 are described hereinabove as controlling both the frequency of the test signal and the frequency that signal strength measurements are made, respectively. For example, both of the phase locked loops may be controlled to generate a test signal and detect signals at a common frequency, e.g., 850 Mhz. Alternatively, the test source phase locked loop 139 may be controlled to inject a test signal at a first frequency, e.g., 830 Mhz, and the receiver module phase locked loop 150 may be controlled to detect the output signals at a second frequency, e.g., 875 Mhz, wherein the difference between the first and second frequencies is the intermediate frequency of the receiver. Therefore, the measurements are made at the receiver intermediate frequency.

High Quality Load 190

The invention is described thus far as determining the leakage signal as the difference between the peak 207 and the average 201 of the output signal 200. However, the leakage signal may also be determined by installing a high quality load 190 (shown in phantom in FIG. 2) into the antenna connector 115.

With the high quality load 190 installed, there is essentially no reflection of the test signal. Therefore, assuming that there is no reflection at the antenna connector, all of the output signal measured by the receiver is due to the leakage signal. Therefore, a leakage signal calibration value may be determined by installing the load 190 and injecting a test signal. Thereafter, the difference between the output signal 200 and the leakage signal calibration value is indicative of the reflected signal.

Figure 4:
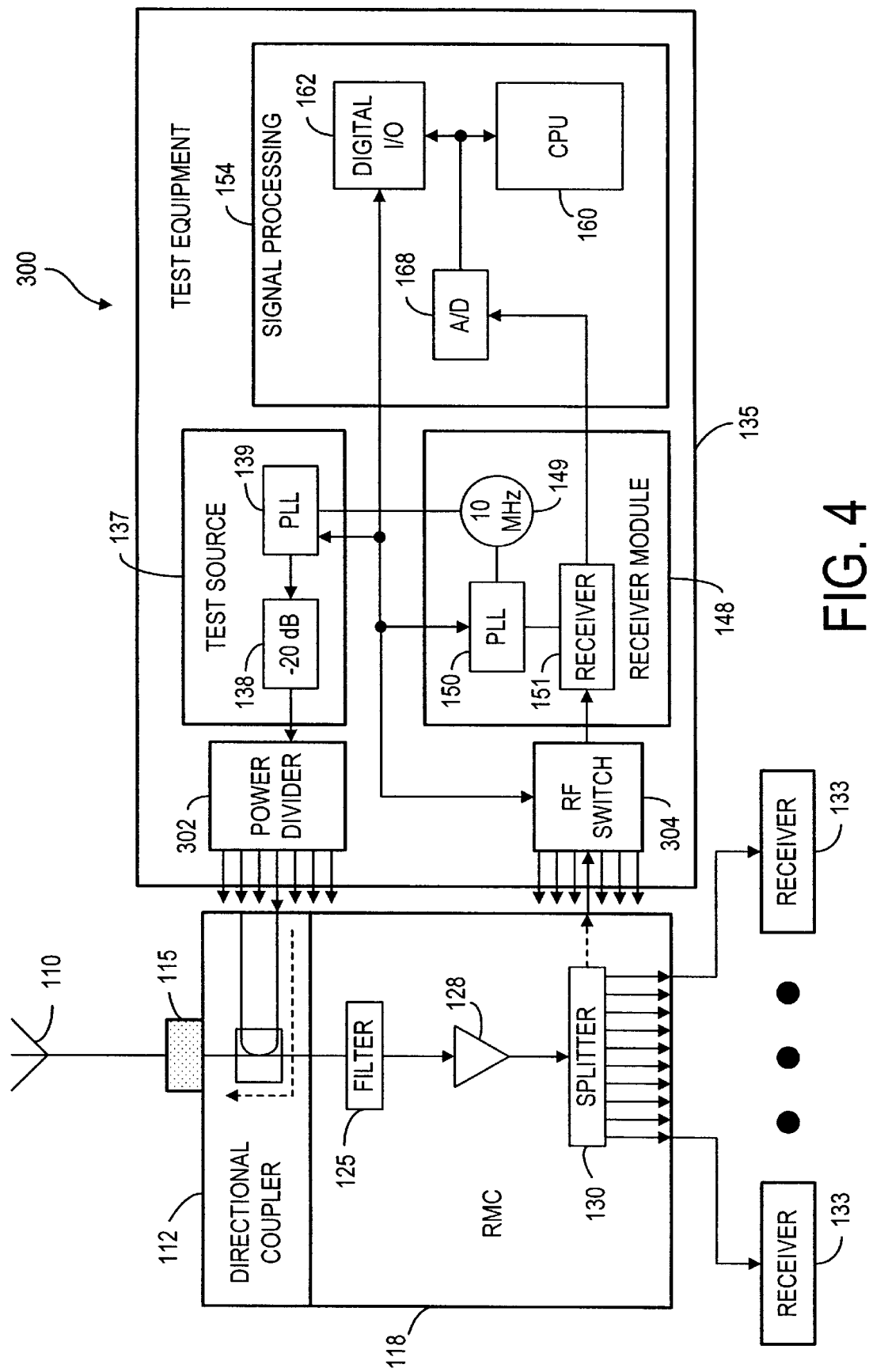
FIG. 4 is a schematic block diagram of a second embodiment of the invention wherein the test apparatus of FIG. 2 is used for testing the characteristics of a plurality of antennas.

FIG. 4: Apparatus Testing a Number of Antennas

FIG. 4 shows an embodiment of the test apparatus generally indicated as 300 for testing a plurality of antennas. In FIG. 4, elements similar to that shown in FIG. 2 are given similar reference numerals.

The test apparatus 300 includes a power divider 302 inserted between the test source 137 and a plurality of directional couplers 112. Therefore, the test source signal may be provided to a plurality of different antennas 110. Similarly, the receiver module 148 may be interconnected to a plurality of different splitters 130 by an RF switch 304. The RF switch 304 may be a one-pole-N-throw switch controlled by the CPU 160.

For testing of a particular antenna, a test signal from the test source 137 is provided to all of the antennas 110 by the power divider 302. The CPU 160 controls the RF switch 304 to provide receive signals from the splitter 130 corresponding to the particular antenna under test. It will be understood by those skilled in the art that an RF switch may be used instead of the power divider 302 for providing test signals to a particular antenna. Control of this switch would be the same as the control of the RF switch 304 connected between the splitters 130 and the receiver module 148.

Although the invention has been described and illustrated with respect to exemplary embodiments thereof, the foregoing and various other changes, omissions and additions may be made therein and thereto without departing from the spirit and scope of the present invention.

What is claimed is:

1. A method for testing an antenna for a voltage standing wave, comprising the steps of:

(A) calibrating the antenna by
 (i) providing a first calibration signal to a directional coupler,
 (ii) measuring a first reflected signal without an antenna connected,
 (iii) connecting the antenna,
 (iv) providing a second calibration signal,
 (v) varying the frequency of the second calibration signal, and
 (vi) determining a calibrated result; and (B) testing the antenna by
 (i) providing a test signal,
 (ii) measuring the test result, and
 (iii) comparing the test signal to the calibrated result to determine the voltage standing wave ratio (VSWR).

* * * * *